US010141899B2

(12) United States Patent
Zhao et al.

(10) Patent No.: US 10,141,899 B2
(45) Date of Patent: *Nov. 27, 2018

(54) BROADBAND RADIO FREQUENCY POWER AMPLIFIERS, AND METHODS OF MANUFACTURE THEREOF

(71) Applicant: NXP USA, Inc., Austin, TX (US)

(72) Inventors: Lei Zhao, Chandler, AZ (US); Jeffrey K. Jones, Chandler, AZ (US); Basim H. Noori, Chandler, AZ (US); Michael E. Watts, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 5 days.

This patent is subject to a terminal disclaimer.

(21) Appl. No.: 15/425,761

(22) Filed: Feb. 6, 2017

(65) Prior Publication Data

US 2017/0149392 A1    May 25, 2017

Related U.S. Application Data

(63) Continuation of application No. 14/529,407, filed on Oct. 31, 2014, now Pat. No. 9,564,861.

(51) Int. Cl.
*H03F 1/56* (2006.01)
*H03F 1/42* (2006.01)
(Continued)

(52) U.S. Cl.
CPC ............. *H03F 1/565* (2013.01); *H01L 23/66* (2013.01); *H01L 24/49* (2013.01); *H03F 1/0288* (2013.01); *H03F 1/42* (2013.01); *H03F 3/193* (2013.01); *H03F 3/195* (2013.01); *H03F 3/213* (2013.01); *H01L 23/3121* (2013.01); *H01L 24/48* (2013.01); *H01L 24/83* (2013.01); *H01L 2223/6611* (2013.01); *H01L 2223/6655* (2013.01); *H01L 2223/6672* (2013.01); *H01L 2223/6688* (2013.01); *H01L 2224/04042* (2013.01); *H01L 2224/05644* (2013.01);
(Continued)

(58) Field of Classification Search
CPC ........ H03F 1/0288; H03F 3/211; H03F 3/195; H03F 2203/21106; H03F 2203/21103; H01L 24/06; H01L 23/66; H01L 24/46; H01L 2224/04042; H01L 2223/6611
USPC ...................................... 330/124 R, 295, 307
See application file for complete search history.

(56) References Cited

U.S. PATENT DOCUMENTS 9,077,285 B2 *   7/2015   Holmes ................. H03F 1/0288

* cited by examiner

*Primary Examiner* — Khanh V Nguyen
*Assistant Examiner* — Khiem Nguyen
(74) *Attorney, Agent, or Firm* — Sherry W. Schumm

(57) ABSTRACT

An embodiment of an amplifier has a bandwidth defined by low and upper cutoff frequencies. The amplifier includes an input impedance matching circuit and a transistor. The transistor has a gate, a first current conducting terminal coupled to an output of the amplifier, and a second current conducting terminal coupled to a reference node. The input impedance matching circuit has a filter input coupled to an input of the amplifier, a filter output coupled to the gate of the transistor, and a multiple pole filter coupled between the filter input and the filter output. A first pole of the filter is positioned at a first frequency within the bandwidth, and a second pole of the filter is positioned at a second frequency outside the bandwidth. The input impedance matching circuit is configured to filter the input RF signal to produce a filtered RF signal at the filter output.

18 Claims, 10 Drawing Sheets

(51) Int. Cl.
*H03F 1/02* (2006.01)
*H03F 3/193* (2006.01)
*H01L 23/66* (2006.01)
*H01L 23/00* (2006.01)
*H03F 3/195* (2006.01)
*H03F 3/213* (2006.01)
*H01L 23/31* (2006.01)

(52) U.S. Cl.
CPC .............. *H01L 2224/2929* (2013.01); *H01L 2224/29339* (2013.01); *H01L 2224/48091* (2013.01); *H01L 2224/48195* (2013.01); *H01L 2224/49175* (2013.01); *H01L 2224/8385* (2013.01); *H01L 2224/83805* (2013.01); *H01L 2924/00014* (2013.01); *H01L 2924/16251* (2013.01); *H01L 2924/19011* (2013.01); *H01L 2924/19041* (2013.01); *H01L 2924/19042* (2013.01); *H01L 2924/19105* (2013.01); *H01L 2924/30105* (2013.01); *H01L 2924/30107* (2013.01); *H03F 2200/222* (2013.01); *H03F 2200/387* (2013.01); *H03F 2200/451* (2013.01)

BROADBAND RADIO FREQUENCY POWER AMPLIFIERS, AND METHODS OF MANUFACTURE THEREOF

RELATED APPLICATION

This application is a continuation of co-pending, U.S. patent application Ser. No. 14/529,407, filed on Oct. 31, 2014, and issued on Feb. 7, 2017 as U.S. Pat. No. 9,564,861.

TECHNICAL FIELD

Embodiments of the subject matter described herein relate generally to radio frequency (RF) power amplifiers, packaged devices that are incorporated into RF power amplifiers, and methods of their manufacture.

BACKGROUND

Radio frequency (RF) power amplifier solutions for cellular base station applications are moving away from single-band single-mode platforms towards multi-band multi-mode platforms in which one power amplifier will be able to cover multiple adjacent frequency bands. In such a platform, the RF power amplifier should be capable of operating over operating frequencies spanning the multiple bands with reasonable performance.

Doherty amplifiers are commonly used for cellular base station applications. However, conventional broadband amplifier designs tend to be limited by impedance dispersion over the covered frequency range. Such high levels of impedance dispersion make such power amplifiers undesirable for broadband Doherty operation. In addition, conventional approaches result in quality factor limitations at the lower end of the band, and relatively large phase linearity variation across the band, both of which may limit Doherty amplifier performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
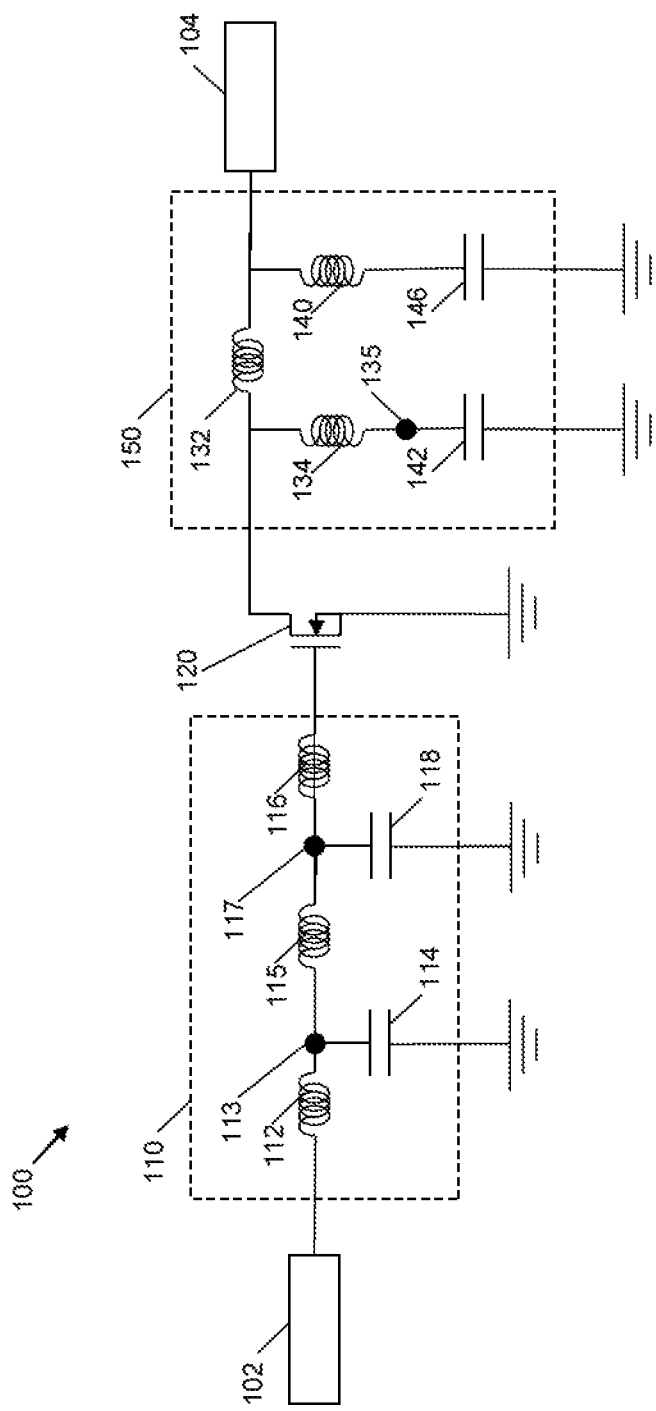
FIG. 1 is a schematic diagram of a radio frequency (RF) power amplifier with an input impedance matching circuit, in accordance with an example embodiment.

A typical radio frequency (RF) power amplifier device includes an input impedance matching circuit coupled to a control terminal of a power transistor, where the input impedance matching circuit is configured to receive and filter an input RF signal. For broadband and multi-band applications, conventional RF power amplifiers have utilized single pole, low pass filters for their input impedance matching circuits to cover the broad band or multiple frequency bands. In such implementations, the pole is located at a frequency above the band's upper cutoff frequency. However, this approach can yield high levels of impedance dispersion, quality factor limitations at the lower end of the band, and relatively large phase linearity variation across the band, as referred to earlier. These characteristics make the single-pole approach particularly performance-limiting and/or unsuitable for use in Doherty power amplifier designs, especially in wideband Doherty power amplifier designs.

More specifically, in a Doherty power amplifier, the output combiner (e.g., combiner 1080, FIG. 10) functions as a transmission line transformer, and the best performance may be achieved when the amplifier as closely emulates a transmission line (with gain) as is possible. Although an input impedance matching circuit with multiple poles theoretically may result in a flatter filter response across a passband, standard RF power amplifier packages are too small to include conventional components for multiple poles. Therefore, to attempt to achieve wider bandwidth devices, the conventional approach is to add components for additional poles outside the RF power amplifier package (e.g., on the PCB to which the RF power amplifier package is coupled). Unfortunately, there is a limit on performance improvements that may be achieved by implementing additional poles outside of an RF power amplifier package so far from the active devices.

Embodiments of the inventive subject matter include RF amplifiers and devices that include multiple-pole input impedance matching circuits. More specifically, embodiments of the inventive subject matter include RF amplifiers and devices in which the amplifier's input impedance matching circuit has at least one pole located within the amplifier's bandwidth (i.e., between the lower and upper cutoff frequencies), and at least one other pole located outside the amplifier's bandwidth. As will be explained in more detail later (e.g., in conjunction with FIGS. 11-16), implementation of a pole within the amplifier's bandwidth may increase the bandwidth and in-band gain flatness of the power amplifier, and may result in near-zero linear phase distortion across the band.

As used herein, the term "bandwidth" refers to a range of frequencies (i.e., between lower and upper cutoff frequencies) at which an amplifier's frequency response is above a threshold (e.g., within 3 decibels of the amplifier's frequency response at its peak). For example, in an RF amplifier that includes a field effect transistor (FET), the lower cutoff frequency may be determined by a drain-source capacitance of the transistor and a shunt inductance connected to the drain, and the upper cutoff frequency may be determined by a gate-source capacitance, a series inductance connected to the gate, and shunt capacitances connected to the series inductance. Other characteristics also or alternatively may determine an amplifier's bandwidth and/or cutoff frequencies.

According to an embodiment, a multiple-pole input impedance matching circuit may be used in an RF amplifier (e.g., a Doherty or other type of amplifier) to provide good broadband performance across a bandwidth spanning about 1.8 gigahertz (GHz) to about 2.2 GHz. In such an embodiment, an RF amplifier includes an input impedance matching circuit with at least one pole that falls between 1.8 GHz and 2.2 GHz, and at least one pole that falls outside of this frequency range. In other embodiments, an RF amplifier may include an input impedance matching circuit with at least one pole that falls within a bandwidth defined by different lower and upper cutoff frequencies.

Figure 7:
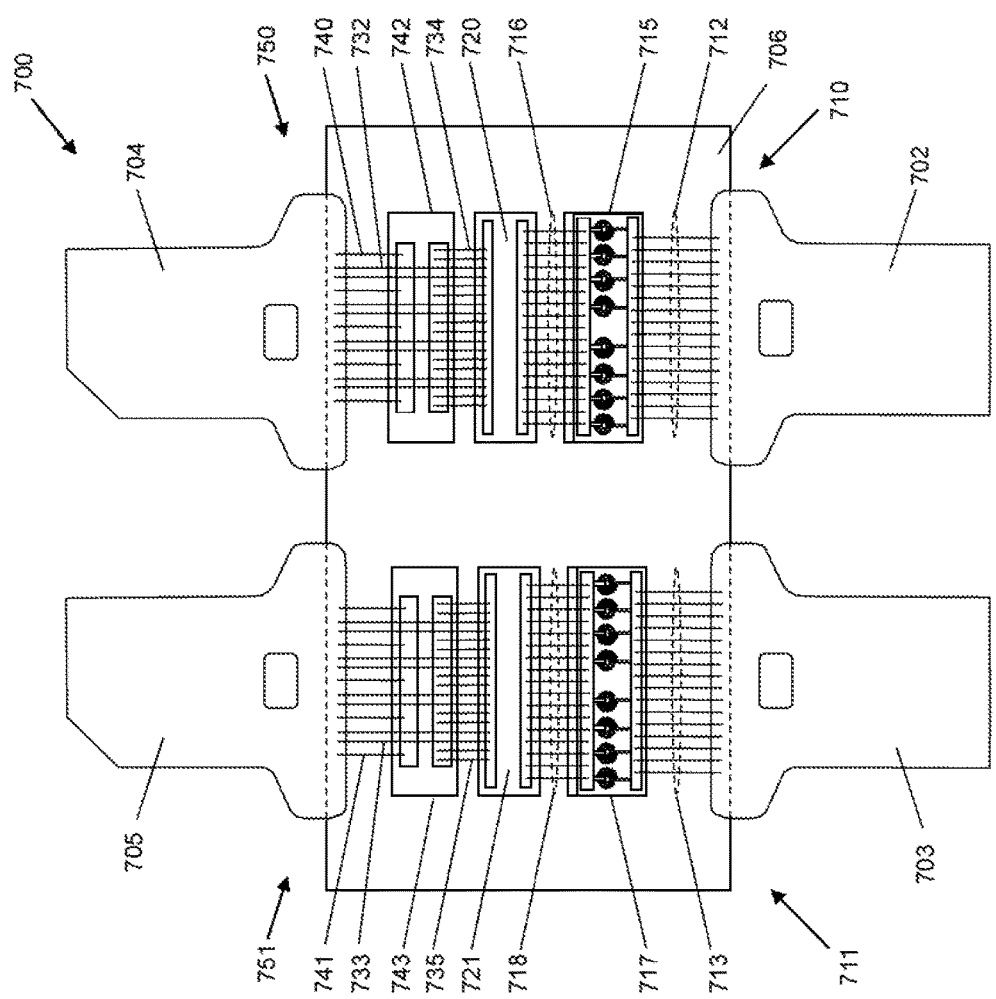
FIG. 7 is a top view of an example of a packaged RF amplifier device that embodies the circuit of FIG. 1, in accordance with an alternate embodiment.
Figure 8:
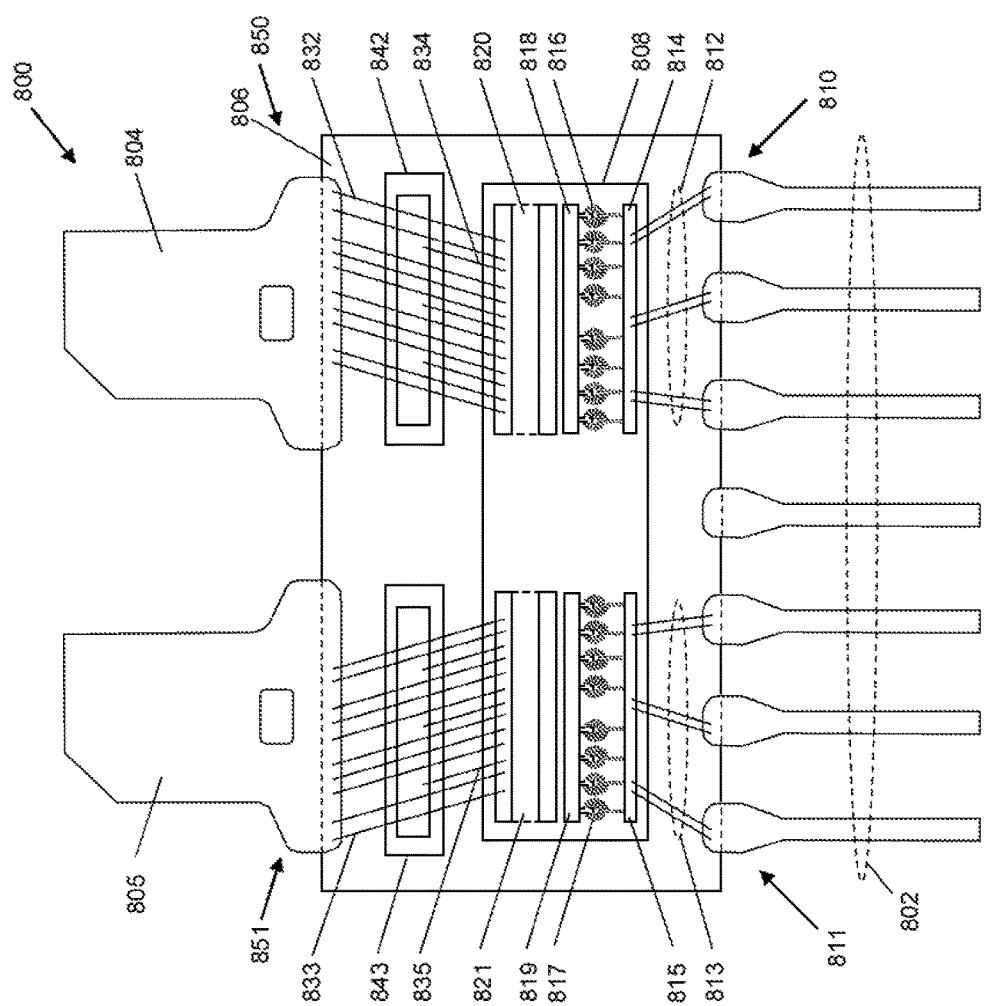
FIG. 8 is a top view of an example of a packaged RF amplifier device that embodies the circuit of FIG. 1, in accordance with another alternate embodiment.

FIG. 1 is a schematic diagram of an RF amplifier device 100. Device 100 includes an input lead 102, an input impedance matching circuit 110, a transistor 120, an output impedance matching circuit 150, and an output lead 104, in an embodiment. Although transistor 120 and various elements of the input and output impedance matching circuits 110, 150 are shown as singular components, the depiction is for the purpose of ease of explanation only. Those of skill in the art would understand, based on the description herein, that transistor 120 and/or certain elements of the input and output impedance matching circuits 110, 150 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., as shown in FIGS. 7 and 8, and including at least two input leads, at least two output leads, transistors, etc.), and/or multi-path devices (e.g., including more than two input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120. Transistor 120 also is located within the device's interior. Output impedance matching circuit 150 is electrically coupled between a second terminal of transistor 120 and the output lead 104, and output impedance matching circuit 150 also is located within the device's interior.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). In a more specific embodiment, transistor 120 may be a laterally diffused MOSFET (LDMOSFET), with bonding pads to the gate and to a first current conducting terminal (e.g., the drain) at a top surface of the transistor 120, and with an electrical connection to the second current conducting terminal (e.g., the source) at a bottom surface of the transistor 120. Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 202 and the control terminal (e.g., gate) of the transistor 120.

According to an embodiment, input impedance matching circuit 110 is a two-section (two pole), low-pass filter circuit. More specifically, input impedance matching circuit 110 includes three inductive elements 112, 115, 116 (e.g., two sets of bondwires and an integrated inductor) and two shunt capacitors 114, 118, in an embodiment. A first inductive element 112 (e.g., a first set of bondwires) is coupled between input lead 102 and a first node 113. A second inductive element 115 (e.g., an integrated inductor) is coupled between the first node 113 and a second node 117. A third inductive element 116 (e.g., a second set of bondwires) is coupled between the second node 117 and the control terminal of transistor 120. A first terminal of a first capacitor 114 is coupled to the first node 113, and a second terminal of the first capacitor 114 is coupled to ground (or another voltage reference). A first terminal of a second capacitor 118 is coupled to the second node 117, and a second terminal of the second capacitor 118 is coupled to ground (or another voltage reference). In other embodiments, input impedance matching circuit 110 may include one or more additional sections or poles.

The values of the components of input impedance matching circuit 110 determine the frequencies of the circuit's two poles (e.g., the frequencies of the in-band pole and the out-of-band pole). In an embodiment, the frequency of the in-band pole is substantially determined by the inductance values of first and second inductive elements 112, 115, and shunt capacitors 114, 118, and the frequency of the out-of-band pole is substantially determined by the inductance value of second inductive element 115 and the capacitance value of shunt capacitor 118. According to an embodiment, first inductive element 112 may have a value in a range between about 50 picohenries (pH) to about 400 pH, second inductive element 115 may have a value in a range between about 100 pH to about 400 pH, third inductive element 116 may have a value in a range between about 30 pH to about 200 pH, shunt capacitor 114 may have a value in a range between about 10 picofarads (pF) to about 30 pF, and shunt capacitor 118 may have a value in a range between about 60 pF to about 120 pF. Essentially, the inductance and capacitance values of inductive elements 112, 115, 116 and capacitors 114, 118 are selected to place the two poles of the input impedance matching circuit 110 in desired locations with respect to the amplifier's bandwidth (i.e., one in-band pole and one out-of-band pole), and ranges for these values may be different, in other embodiments.

Output impedance matching circuit 150 is configured to match the output impedance of device 100 with the input impedance of an external circuit or component (not shown) that may be coupled to output lead 104. Output impedance matching circuit 150 is coupled between the first current conducting terminal (e.g., drain) of transistor 120 and the output lead 104. According to an embodiment, output impedance matching circuit 150 is a shunt-inductance (shunt-L) high-pass filter circuit. More specifically, output impedance matching circuit 150 includes three inductive elements 132, 134, 140 (e.g., three sets of bondwires) and two capacitors 142, 146, in an embodiment. A first inductive element 132 (e.g., a third set of bondwires), is coupled between the first current conducting terminal (e.g., drain) of transistor 120 and the output lead 104. A second inductive element 134 (e.g., a fourth set of bondwires) is coupled between the first current conducting terminal of transistor 120 and a third node 135. A first terminal of a first capacitor 142 is coupled is coupled to the third node 135. A third inductive element 140 (e.g., a fifth set of bondwires) is coupled between the output lead 104 and a first terminal of a second capacitor 146. Second terminals of capacitors 142, 146 are coupled to ground (or to another voltage reference), in an embodiment.

Inductance 134 and capacitor 142 are coupled in series between a current conducting terminal of transistor 120 and ground, and this combination of impedance matching elements functions as a first (high-pass) matching stage. According to an embodiment inductance 134 may have a value in a range between about 100 pH to about 3 nH, and shunt capacitor 142 may have a value in a range between about 50 pF to about 500 pF, although these components may have values outside of these ranges, as well.

An RF "cold point" is present at the node 135 between shunt inductance 134 and shunt capacitor 142, where the RF cold point represents a high impedance point in the circuit. Although not shown in FIG. 1, device 100 also may include an envelope frequency termination circuit (e.g., a series coupled inductance, resistor, and capacitor) coupled between the RF cold point (at node 135) and ground (or another voltage reference). The envelope frequency termination circuit may function to improve the low frequency resonance of device 100 caused by the interaction between the output impedance matching circuit 150 and bias feeds (not shown) by presenting a high impedance at RF frequencies.

Inductance 140 and capacitor 146 are coupled in series between the output lead 104 and ground (or another voltage reference), and this combination of impedance matching elements functions as a second (low-pass) matching stage. According to an embodiment inductance 140 may have a value in a range between about 50 pH to about 1 nH, and capacitor 146 may have a value in a range between about 1 pF to about 50 pF, although these components may have values outside of these ranges, as well. According to an alternate embodiment, inductance 140 and capacitor 146 may be excluded altogether from device 100.

Figure 2:
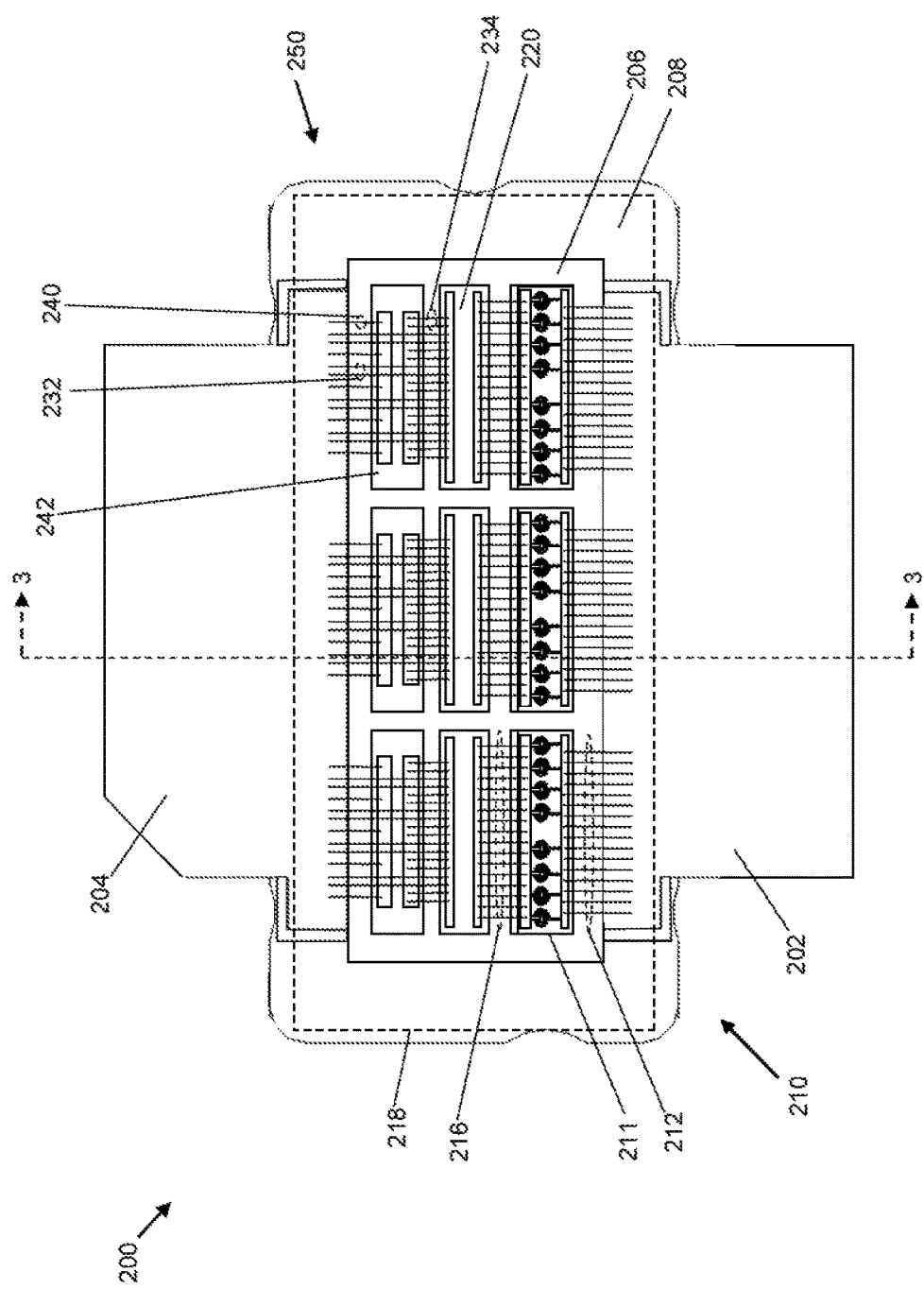
FIG. 2 is a top view of an example of a packaged RF amplifier device that embodies the circuit of FIG. 1, in accordance with an embodiment.

FIG. 2 is a top view of an example of a packaged RF amplifier device 200 that embodies multiple parallel instances of the circuit of FIG. 1, and that includes an integrated passive device (IPD) 211 as part of an input impedance matching circuit 210, in accordance with an example embodiment. More particularly, the interconnected electrical components and elements of device 200 along each amplification path may be modeled by the schematic diagram of FIG. 1. For enhanced understanding, FIG. 2 should be viewed in conjunction with FIGS. 3 and 4, which are cross-sectional, side views of the semiconductor device 200 of FIG. 2 along line 3-3, according to two alternate embodiments.

Device 200 includes an input lead 202 (e.g., input lead 102, FIG. 1), an output lead 204 (e.g., output lead 104, FIG. 1), a flange 206, one or more transistors 220 (e.g., transistor 120, FIG. 1), one or more input impedance matching circuits 210 (e.g., input impedance matching circuit 110, FIG. 1), and one or more output impedance matching circuits 250 (e.g., output impedance matching circuit 150, FIG. 1), all of which may be packaged together as parts of the device.

Figure 3:
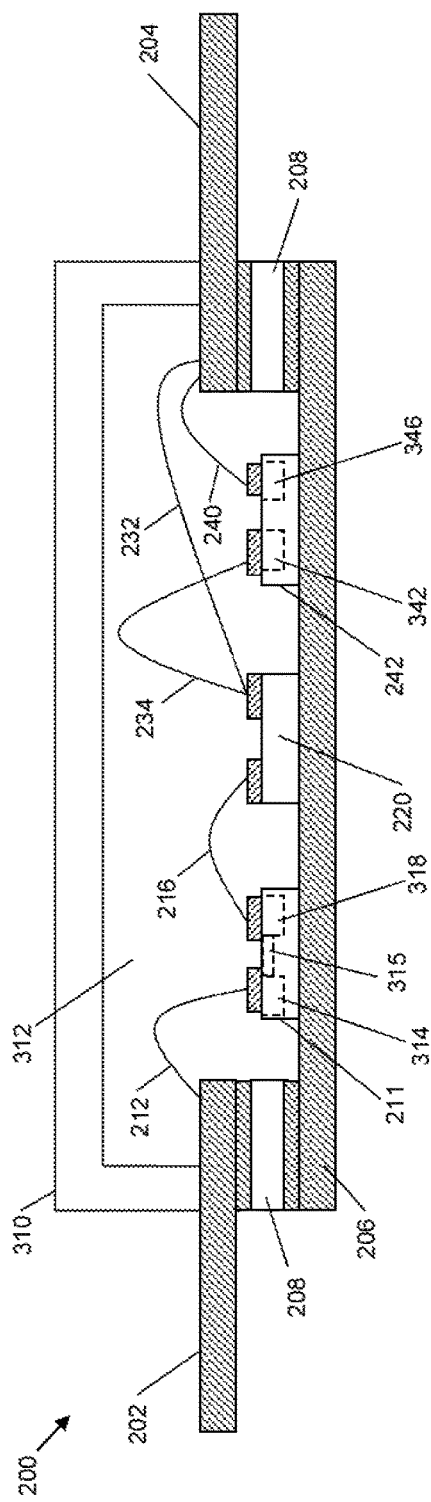
FIG. 3 is a cross-sectional, side view of the RF amplifier device of FIG. 2 along line 3-3.

According to an embodiment, and referring also to FIG. 3, device 200 is incorporated in an air cavity package, in which transistors 220 and various impedance matching elements 211, 212, 216, 232, 234, 240, and 242 are located within an enclosed air cavity 312. Basically, the air cavity is bounded by flange 206, isolation structure 208, and a cap 310 overlying and in contact with the isolation structure 208 and leads 202, 204. In FIG. 2, an example perimeter of the cap 310 is indicated by dashed box 218. In the air cavity embodiment, device 200 also includes an isolation structure 208 coupled to the top surface of the flange 206, and to which the leads 202, 204 are coupled. The isolation structure 208 serves to electrically isolate the leads 202, 204 from the flange 206. More specifically, isolation structure 208 is formed from a rigid, electrically insulating material (i.e., a material with a dielectric constant in a range from about 2.0 to about 10.0, although materials with higher or lower dielectric constants may be used), and has a top surface and an opposed bottom surface.

Figure 4:
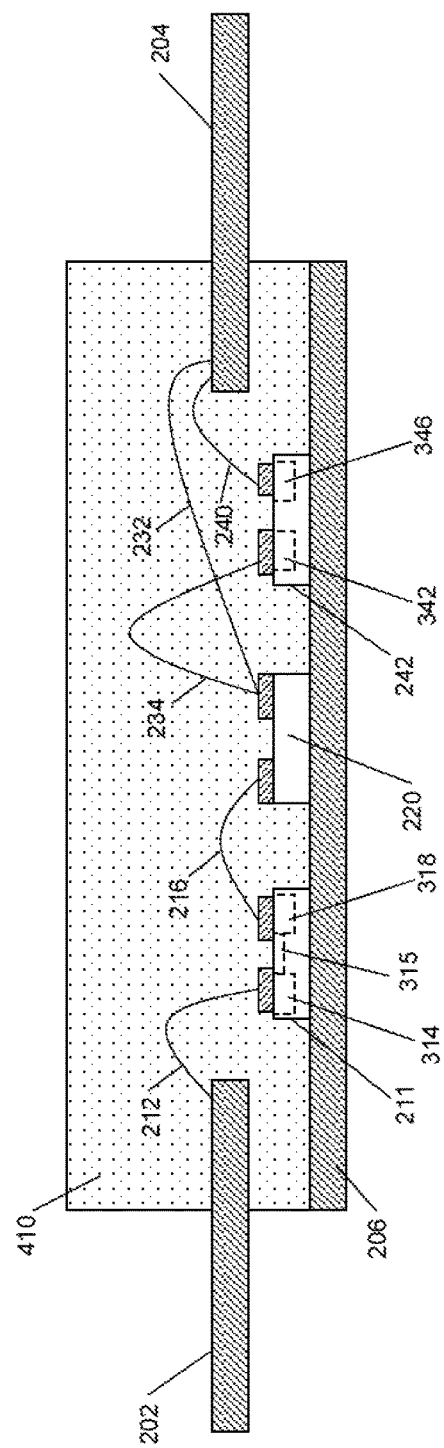
FIG. 4 is a cross-sectional, side view of an RF amplifier device, in accordance with an alternate embodiment.

In an alternate embodiment, such as is illustrated in FIG. 4, the device may be incorporated into an overmolded package. More specifically, transistors 220 and various impedance matching elements 212, 211, 216, 232, 234, 240, and 242 are encapsulated with a non-conductive molding compound 410, along with portions of the leads 202, 204. In the overmolded embodiment, electrical isolation between the leads 202, 204 and the flange 206 is provided by the molding compound 410, and an isolation structure (e.g., isolation structure 208) may be excluded from the device.

Transistors 220 and various elements (e.g., components integrated in IPDs 211, 242) of the input and output impedance matching circuits 210, 250 are mounted on a generally central portion of the top surface of flange 206. For example, the transistors 220 and IPDs 211, 242 may be coupled to flange 206 using conductive epoxy, solder, solder bumps, sintering, and/or eutectic bonds.

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208).

Flange 206 is formed from a conductive material, and may be used to provide a ground reference for the device 200. For example, various components and elements may have terminals that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

In the example of FIG. 2, device 200 includes three transistors 220 that essentially function in parallel, although another semiconductor device may include one or two transistors or more than three transistors, as well. In addition, device 200 includes three input-side IPDs 211 that form portions of the input impedance matching circuits 210, and three output-side IPDs 242 that form portions of the output impedance matching circuits 250. Each series of an interconnected input side IPD 211, transistor 220, and output side IPD 242 corresponds to one of three amplification paths, which essentially function in parallel. It is to be understood that more or fewer of input-side IPDs 211, transistors 220, and/or output-side IPDs 242 may be implemented, as well. For purposes of clarity, transistors 220, input-side IPDs 211, and/or output-side IPDs 242 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 220, input-side IPDs 211, and/or output-side IPDs 242, in order to provide low frequency paths between corresponding components.

Each transistor 220 has a control terminal (e.g., a gate) and two current conducting terminals (e.g., a drain and a source). The control terminal of each transistor 220 is coupled to the input impedance matching circuit 210 (e.g., through bondwires 216 between input-side IPD 211 and transistor 220). In addition, one current conducting terminal (e.g., the drain) is coupled to the output impedance matching circuit 250 (e.g., through bondwires 234 between transistor 220 and output-side IPD 242) and to the output lead 204 (e.g., through bondwires 232 between transistor 220 and output lead 204). The other current conducting terminal (e.g., the source) is coupled to the flange 206 (e.g., to ground), in an embodiment.

The input impedance matching circuit 210 (e.g., input impedance matching circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input impedance matching circuit 210 includes three inductive elements 212, 315, 216 (e.g., inductive elements 112, 115, 116, FIG. 1) and two shunt capacitors (e.g., capacitors 114, 118, FIG. 1). Inductive elements 212, 216 each are formed from a plurality of parallel, closely-spaced sets of bondwires, in an embodiment. For example, a first inductive element 212 (e.g., inductive element 112, FIG. 1) includes a first plurality of bondwires coupled between input lead 202 and the input-side IPD 211 (e.g., a first conductive pad on the top surface of input-side IPD 211), and a second inductive element 216 (e.g., inductive element 116, FIG. 1) includes a second plurality of bondwires coupled between the control terminal of transistor 220 and the input-side IPD 211 (e.g., a second conductive pad on the top surface of input-side IPD 211). Referring also to FIGS. 3 and 4, and as will be explained in more detail in conjunction with the description of FIGS. 5 and 6, input-side IPD 211 may include two shunt capacitors 314, 318 (e.g., capacitors 114, 118, FIG. 1) and an integrated inductor 315 (e.g., inductor 115, FIG. 1), coupled between the shunt capacitors 314, 318. Because the input-side IPDs 211 may include components for at least one additional pole (i.e., integrated inductor 315 and shunt capacitor 318), incorporation of the input-side IPDs 211 into the device package enables a flatter filter response across the device's passband to be achieved, when compared with conventional approaches in which additional poles could be implemented only on the PCB level.

The output impedance matching circuit 250 (e.g., output impedance matching circuit 150, FIG. 1) is coupled between a first current conducting terminal (e.g., drain) of transistor 220 (e.g., transistor 120, FIG. 1) and the output lead 204 (e.g., output lead 104, FIG. 1). In the device 200 of FIG. 2, the output impedance matching circuit 250 includes three inductive elements 232, 234, 240 (e.g., inductors 132, 134, 140, FIG. 1) and two capacitors 342, 346 (e.g., capacitors 142, 146, FIG. 1).

Again, inductive elements 232, 234, 240 each may be formed from a plurality of parallel, closely-spaced sets of bondwires, in an embodiment. For example, one inductive element 232 (e.g., inductance 132, FIG. 1) includes a third plurality of bondwires coupled between the first current conducting terminal (e.g., the drain) of transistor 220 and the output lead 204. Referring also to FIGS. 3 and 4, another inductive element 234 (e.g., inductance 134, FIG. 1) includes a fourth plurality of bondwires coupled between the first current conducting terminal of transistor 220 and a first terminal of a shunt capacitor 342 within output side IPD 242 (e.g., shunt capacitor 142, FIG. 1). More particularly, the fourth plurality of bondwires is coupled to a first conductive pad on the top surface of output-side IPD 242, where the first conductive pad corresponds to the RF cold point (e.g., node 135, FIG. 1). Yet another inductive element 240 (e.g., inductance 140, FIG. 1), formed from a fifth plurality of bondwires, is coupled between the output lead 204 and a first terminal of a second shunt capacitor 346 of output-side IPD 242 (e.g., capacitor 146, FIG. 1). More particularly, the fifth plurality of bondwires is coupled to a second conductive pad on the top surface of output-side IPD 242. Second terminals of capacitors 342, 346 are electrically connected to the flange 206 (e.g., to ground).

Figure 5:
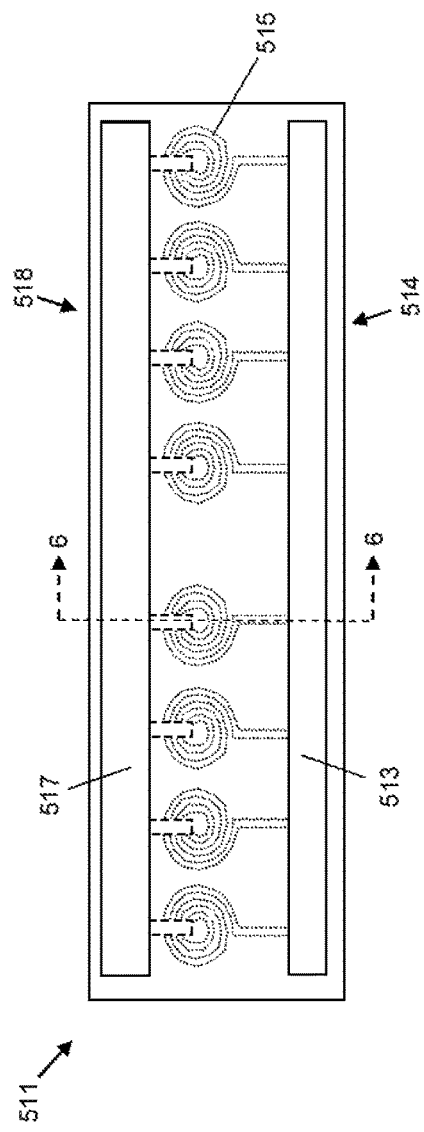
FIG. 5 is a top view of an integrated passive device (IPD) that includes components of an input impedance matching circuit, in accordance with an example embodiment.

As will be explained in more detail now in conjunction with FIGS. 5 and 6, some components of the input impedance matching circuit 110, 210 are integrated within the input-side IPD 211. FIG. 5 is a top view of an IPD 511 (e.g., input-side IPD 211) that includes components of an input impedance matching circuit (e.g., components of input impedance matching circuit 110, 210, FIGS. 1, 2), in accordance with an example embodiment. For enhanced understanding, FIG. 5 should be viewed in parallel with FIG. 6, which is a cross-sectional, side view of the IPD 511 of FIG. 5 along line 6-6.

According to an embodiment, IPD 511 includes components corresponding to two shunt capacitors 514, 518 (i.e., capacitors 114, 118, FIG. 1) and an inductance 515 (i.e., inductance 115, FIG. 1) of the input impedance matching circuit. More particularly, in an embodiment, shunt capacitors 514, 518, and inductance 515 are integrally formed in IPD 511. Inductance 515 is shown in dotted line in FIG. 5, as it is hidden below the top surface of IPD 511 in the top-surface view.

IPD 511 includes a semiconductor substrate 610 with top and bottom surfaces 612, 614. The semiconductor substrate 610 may be formed from any of a variety of semiconductor materials, including but not limited to silicon (including silicon-on-insulator, silicon-on-sapphire, and other silicon-based composite substrates), gallium arsenide (GaAs), gallium nitride (GaN, including GaN-on-silicon, and other GaN-based composite substrates), and so on. A plurality of conductive layers 620, 622 and insulating layers 626, 628 are formed over the top surface 612 of the substrate 610. The insulating layers 626 function to selectively electrically isolate the conductive layers 620, 622. IPD 511 also includes an additional conductive layer 624 formed on the bottom surface 614 of the substrate 610 to facilitate electrical attachment to an underlying substrate (e.g., flange 206, FIG. 2), according to an embodiment. For example, conductive layer 624 may be a gold (or other metal) layer, which facilitates forming a solder, eutectic, or conductive epoxy bond between IPD 511 and a separate conductive substrate (e.g., flange 206, FIG. 2). Alternatively, conductive layer 624 may be a metal layer, which facilitates sintering (e.g., silver sintering) IPD 511 to the separate conductive substrate.

Figure 6:
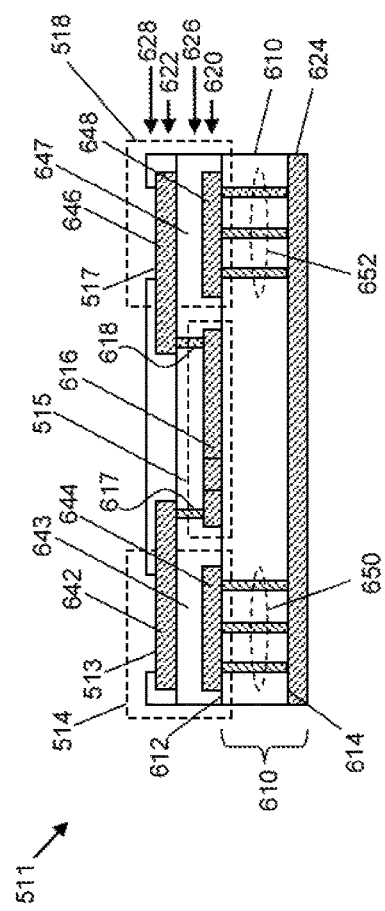
FIG. 6 is a cross-sectional, side view of the IPD of FIG. 5 along line 6-6.

Referring to FIGS. 5 and 6, and as mentioned above, IPD 511 includes a first shunt capacitor 514 (e.g., capacitor 114, FIG. 1), and a second shunt capacitor 518 (e.g., capacitor 118, FIG. 1), in an embodiment. For example, first shunt capacitor 514 may have a value in a range between about 10 pF to about 30 pF, and second shunt capacitor 518 may have a value in a range between about 60 pF to about 120 pF, although the capacitance values may be lower or higher, in other embodiments. Further, inductance 515 may have a value in a range between about 100 pH to about 400 pH, although the inductance value may be lower or higher, in other embodiments.

According to an embodiment, first capacitor 514 and second capacitor 518 each is implemented as metal-insulator-metal (MIM) capacitors (e.g., with parallel metal plates electrically separated by a thin dielectric (e.g., a thin nitride or oxide)), which are depicted in simplified form in FIG. 6. In an actual implementation, the portions of each MIM capacitor may be formed using different and/or more complicated metal and dielectric structures. In any event, in an embodiment, first capacitor 514 includes a top capacitor electrode 642 formed from a portion of conductive layer 622, a bottom capacitor electrode 644 formed from a portion of conductive layer 620 and vertically aligned with the top capacitor electrode 642, and dielectric material 643 formed from a portion of insulating layer 626. Similarly, second capacitor 518 includes a top capacitor electrode 646 formed from a portion of conductive layer 622, a bottom capacitor electrode 648 formed from a portion of conductive layer 620 and vertically aligned with the top capacitor electrode 646, and dielectric material 647 formed from a portion of insulating layer 626.

According to an embodiment, IPD 511 also includes first and second sets of conductive through substrate vias (TSVs) 650, 652 extending between the top and bottom surfaces 612, 614 of substrate 610. The first set of TSVs 650 is electrically coupled to the bottom capacitor electrode 644 of first shunt capacitor 514, and the second set of TSVs 652 is electrically coupled to the bottom capacitor electrode 648 of second shunt capacitor 518. In addition, both the first and second sets of TSVs 650, 652 are electrically coupled to the conductive layer 624 on the bottom surface 614 of the substrate 610. In an alternate embodiment, conductive pads or balls may be coupled to the ends of the TSVs 650, 652 that are coplanar with the bottom surface 614 of the substrate 610, rather than being electrically coupled to conductive layer 624. In yet another alternate embodiment, TSVs 650 and/or 652 may be replaced by edge plating or castellations on the side surface(s) of IPD 511, which extend between the top and bottom surfaces of substrate 610.

In an embodiment, inductance 515 is implemented as a conductive coil, which has a first end electrically coupled to the top capacitor electrode 642 of the first shunt capacitor 514, and a second end electrically coupled to the top capacitor electrode 646 of the second shunt capacitor 518. For example, in an embodiment, the coil corresponding to inductance 515 may be formed from a portion of a single conductive layer, such as conductive layer 622, and the first and second ends of the coil could be coupled to the top capacitor electrodes 642, 646 through conductive vias 617, 618. Alternatively, the coil corresponding to inductance 515 may be formed from multiple conductive layers that are interconnected with conductive vias.

To facilitate interconnection of first shunt capacitor 514 and second shunt capacitor 518 to external circuitry (e.g., to transistor 120, 220 and/or input lead 102, 202, FIGS. 1, 2), IPD 511 also includes contact pads 513, 517 exposed at its top surface. According to an embodiment, each contact pad 513, 517 is configured to accept attachment of one or more bondwires (e.g., bondwires 212, 216). The contact pads 513, 517 may be formed from the same conductive layer 622 as top electrodes 642, 646, as illustrated in FIG. 6, or the contact pads 513, 517 may be formed from different conductive layers than top electrodes 642, 646. When IPD 511 is incorporated into an RF amplifier device such as RF amplifier device 100, contact pad 513 corresponds to node 113 of FIG. 1, and contact pad 517 corresponds to node 117 of FIG. 1.

Although the electrodes 642, 644, 646, 648 of the first and second shunt capacitors 514, 518 are illustrated as being formed from portions of the same conductive layers (i.e., layers 620, 622), the electrodes 642, 644, 646, 648 of capacitors 514, 518 may be formed from portions of different layers from each other and/or from different layers than those depicted in FIG. 6 (e.g., one or more other conductive layers, not illustrated, may be present below or above the conductive layers 620, 622 from which capacitors 514, 518 are formed). In addition, although each of capacitors 514, 518 are illustrated as simple parallel plate capacitors consisting of a single top electrode and a single bottom electrode, either or both of capacitors 514, 518 could have other types of capacitor structures, as well (e.g., the electrodes could consist of multiple, interleaved conductive structures, and so on).

In the embodiment depicted in FIGS. 5 and 6, shunt capacitors 514, 518, and inductance 515 are integrally formed in IPD 511. In alternate embodiments, either or both of shunt capacitors 514, 518 may be discrete capacitors that are mounted on a top surface of the input-side IPD. In other alternate embodiments, inductance 515 could be implemented as a discrete component mounted to the top surface of the input-side IPD, or inductance 515 could be implemented as a parallel set of bondwires (e.g., coupled between pads 513 and 517.

In the embodiment of FIG. 2, the amplifier device 200 includes three parallel amplification paths coupled between a single input lead 202 and a single output lead 204. In alternate embodiments, multiple parallel amplification paths may be coupled between multiple input leads and multiple output leads. For example, FIG. 7 is a top view of an example of a packaged RF amplifier device 700 that includes two parallel amplification paths, each of which may embody the circuit of FIG. 1, and each of which is coupled between distinct input leads 702, 703 and output leads 704, 705, in accordance with an alternate embodiment. In addition, similar to the embodiment of FIG. 2, along both paths, device 200 includes an IPD 715, 717 as part of each input impedance matching circuit 710, 711, in accordance with an example embodiment. Corresponding components along each amplification path may or may not be substantially identical (e.g., transistors 720, 721 may or may not be substantially identical). In some embodiments, some or all of the corresponding components along the two paths may be different from each other (e.g., one transistor 720 may be a different size from the other transistor 721, and/or the values for corresponding input and/or output impedance matching circuit components may be different in the two different paths). Because the corresponding components may be different, the corresponding components are given distinct reference numbers.

Device 700 includes two input leads 702, 703, two output leads 704, 705, a flange 706, at least two transistors 720, 721, two input impedance matching circuits 710, 711, and two output impedance matching circuits 750, 751, all of which may be packaged together as parts of the device 700. Device 700 may be implemented as an air-cavity package or as an overmolded package, as discussed previously.

Transistors 720, 721 and various elements of the input and output impedance matching circuits 710, 711, 750, 751 (e.g., components integrated in IPDs 715, 717, 742, 743) are mounted on a generally central portion of the top surface of flange 706. For example, the transistors 720, 721 and IPDs 715, 717, 742, 743 may be coupled to flange 706 using conductive epoxy, solder, solder bumps, sintering, and/or eutectic bonds. Flange 706 includes a rigid electrically-conductive substrate, and may be used to provide a ground reference for the device 700.

In the example of FIG. 7, device 700 includes two transistors 720, 721 that essentially function in parallel, although another semiconductor device may include one or more than two transistors, as well. In addition, device 700 includes two input-side IPDs 715, 717 that form portions of the input impedance matching circuits 710, 711, and two output-side IPDs 742, 743 that form portions of the output impedance matching circuits 750, 751. Each series of an interconnected input side IPD 715, 717, transistor 720, 721, and output side IPD 742, 743 corresponds to one of two amplification paths. For example, one of the amplification paths may correspond to a main amplification path of a Doherty power amplifier (e.g., Doherty power amplifier 1000, FIG. 10), and the other amplification path may correspond to a peaking amplification path of a Doherty power amplifier. In an alternate embodiment, a device may have one or more additional amplification paths (e.g., to provide for one or more additional peaking paths).

Each transistor 720, 721 has a control terminal (e.g., a gate) and two current conducting terminals (e.g., a drain and a source). The control terminal of each transistor 720, 721 is coupled to an input impedance matching circuit 710, 711 (e.g., through bondwires 716, 718 between input-side IPDs 715, 717 and transistors 720, 721). In addition, one current conducting terminal (e.g., the drain) is coupled to an output impedance matching circuit 750, 751 (e.g., through bondwires 734, 735 between transistors 720, 721 and output-side IPDs 742, 743) and to the output leads 704, 705 (e.g., through bondwires 732, 733 between transistors 720, 721 and output leads 704, 705). The other current conducting terminal (e.g., the source) is coupled to the flange 706 (e.g., to ground), in an embodiment.

The input impedance matching circuits 710, 711 (e.g., input impedance matching circuit 110, FIG. 1) are coupled between the input leads 702, 703 (e.g., input lead 102, FIG. 1) and the control terminals of the transistors 720, 721 (e.g., transistor 120, FIG. 1). In the device 700 of FIG. 7, the input impedance matching circuits 710, 711 each include three inductive elements. More specifically, in each path, the three inductive elements include two sets of bondwires 712, 713, 716, 718 and an integrated inductor (e.g., inductor 515, FIG. 5) in the IPDs 715, 717. In addition, the input impedance matching circuits 710, 711 each include two shunt capacitors (e.g., capacitors 514, 518, FIG. 5) integrated in the IPDs 715, 717. Once again, because the input-side IPDs 715, 717 may include components for at least one additional pole (i.e., an integrated inductor and a shunt capacitor), incorporation of the input-side IPDs 715, 717 into the device package enables a flatter filter response across the device's passband to be achieved, when compared with conventional approaches.

The output impedance matching circuits 750, 751 (e.g., output impedance matching circuit 150, FIG. 1) are coupled between first current conducting terminals (e.g., drains) of transistors 720, 721 (e.g., transistor 120, FIG. 1) and the output leads 704, 705 (e.g., output lead 104, FIG. 1). In the device 700 of FIG. 7, the output impedance matching circuits 750, 751 each include three inductive elements 732, 733, 734, 735, 740, 741 (e.g., inductors 132, 134, 140, FIG. 1) and two capacitors integrated in IPDs 742, 743 (e.g., capacitors 142, 146, FIG. 1). Again, inductive elements 732, 733, 734, 735, 740, 741 each may be formed from a plurality of parallel, closely-spaced sets of bondwires, in an embodiment.

In the embodiments depicted in FIGS. 2-7, the shunt capacitors 514, 518 and inductances 515 of the input impedance matching circuits 210, 510, 710, 711 are integrated in IPDs 215, 511, 715, 717 that are distinct from the transistor die (e.g., transistor die 220, 720, 721). In an alternate embodiment, some or all of the shunt capacitors and the inductances of the input impedance matching circuits may be integrated within the transistor die.

For example, FIG. 8 is a top view of an example of a packaged RF amplifier device 800 that includes components of the input impedance matching circuit (e.g., circuit 110, FIG. 1) integrated within a transistor die 808, in accordance with another alternate embodiment. The embodiment of FIG. 8 includes two parallel amplification paths, each of which may embody the circuit of FIG. 1, and each of which is coupled between input leads 802 and output leads 804, 805, in accordance with an alternate embodiment. Unlike the embodiments of FIGS. 2 and 7, the device 800 does not include input-side IPDs along the amplification paths. Instead, integrated components of each input impedance matching circuit are incorporated into the transistor die 808, in accordance with an example embodiment. Again, corresponding components along each amplification path may or may not be substantially identical (e.g., transistors 820, 821 may or may not be substantially identical). Accordingly, the corresponding components are given distinct reference numbers.

Device 800 includes a plurality of input leads 802, two output leads 804, 805, a flange 806, at least two transistors 820, 821, two input impedance matching circuits 810, 811, and two output impedance matching circuits 850, 851, all of which may be packaged together as parts of the device 800. Device 800 may be implemented as an air-cavity package or as an overmolded package, as discussed previously.

Die 808 and various elements of the output impedance matching circuits 850, 851 (e.g., components integrated in IPDs 842, 843) are mounted on a generally central portion of the top surface of flange 806. For example, the die 808 and IPDs 842, 843 may be coupled to flange 806 using conductive epoxy, solder, solder bumps, sintering, and/or eutectic bonds. Flange 806 includes a rigid electrically-conductive substrate, and may be used to provide a ground reference for the device 800.

In the example of FIG. 8, device 800 includes two transistors 820, 821 integrated within die 808 that essentially function in parallel, although another semiconductor device may include one or more than two transistors, as well. In addition, device 800 includes two input impedance matching circuits 810, 811, where some components of the input impedance matching circuits 810, 811 are integrated within die 808. Device 800 also includes two output-side IPDs 842, 843 that form portions of the output impedance matching circuits 850, 851.

The input impedance matching circuits 810, 811 (e.g., input impedance matching circuit 110, FIG. 1) are coupled between the input leads 802 (e.g., input lead 102, FIG. 1) and the control terminals of the transistors 820, 821 (e.g., transistor 120, FIG. 1). In the device 800 of FIG. 8, the input impedance matching circuits 810, 811 each include at least two inductive elements. More specifically, in each path, the inductive elements include a set of bondwires 812, 813 (e.g., corresponding to inductive element 112, FIG. 1) and an integrated inductor 816, 817 (e.g., similar to inductor 515, FIG. 5) integrated in die 808. In addition, the input impedance matching circuits 810, 811 each include two shunt capacitors 814, 815, 818, 819 (e.g., similar to capacitors 514, 518, FIG. 5) integrated in die 808. Similar to the previously-described embodiments, because the transistor die 808 may include components for more than one input impedance matching circuit pole (i.e., integrated inductors 816, 817 and the additional shunt capacitors 818, 819), incorporation of such a transistor die 808 into the device package enables a flatter filter response across the device's passband to be achieved, when compared with conventional approaches.

Each transistor 820, 821 has a control terminal (e.g., a gate) and two current conducting terminals (e.g., a drain and a source). The control terminal of each transistor 820, 821 is coupled to an input impedance matching circuit 810, 811 (e.g., through conductive structures within die 808, not illustrated). In addition, one current conducting terminal (e.g., the drain) is coupled to an output impedance matching circuit 850, 851 (e.g., through bondwires 834, 835 between transistors 820, 821 and output-side IPDs 842, 843) and to the output leads 804, 805 (e.g., through bondwires 832, 833 between transistors 820, 821 and output leads 804, 805). The other current conducting terminal (e.g., the source) is coupled to the flange 806 (e.g., to ground), in an embodiment.

The output impedance matching circuits 850, 851 (e.g., output impedance matching circuit 150, FIG. 1) are coupled between first current conducting terminals (e.g., drains) of transistors 820, 821 (e.g., transistor 120, FIG. 1) and the output leads 804, 805 (e.g., output lead 104, FIG. 1). In the device 800 of FIG. 8, the output impedance matching circuits 850, 851 each include two inductive elements 832, 833, 834, 835 (e.g., inductors 132, 134, FIG. 1) and one capacitor integrated in IPDs 842, 843 (e.g., capacitor 142, FIG. 1). The embodiment of FIG. 8 does not include components corresponding to a second matching stage (e.g., inductive element 140 and capacitor 146, FIG. 1), although it may include these components, in an alternate embodiment. Again, inductive elements 832, 833, 834, 835 each may be formed from a plurality of parallel, closely-spaced sets of bondwires, in an embodiment.

FIG. 8 illustrates that the transistors (e.g., transistors 820, 821 for multiple paths may be incorporated onto the same die, in contrast with the embodiments of FIGS. 2 and 7 in which each transistor 220, 720, 721 is incorporated onto a single die. In addition, FIG. 8 illustrates that the integrated components of the input impedance matching circuits for multiple paths may be incorporated onto the same die, in contrast with the embodiments of FIGS. 2 and 7, in which distinct IPDs 215, 715, 717 were used for each amplification path. The same modification could be made for the integrated components of the output impedance matching circuits, in alternate embodiments. More specifically, although each of the illustrated embodiments illustrates the integrated components of the output impedance matching circuits for each amplification path are integrated into distinct IPDs 242, 742, 743, 842, 843, alternate embodiments may include an IPD with integrated components of output impedance matching circuits for multiple amplification paths. Further, although the embodiments of FIGS. 2, 7, and 8 indicate that each transistor die 220, 720, 721, 808 includes only a single amplification stage along each amplification path, in other embodiments, two stage amplification may be implemented.

Figure 9:
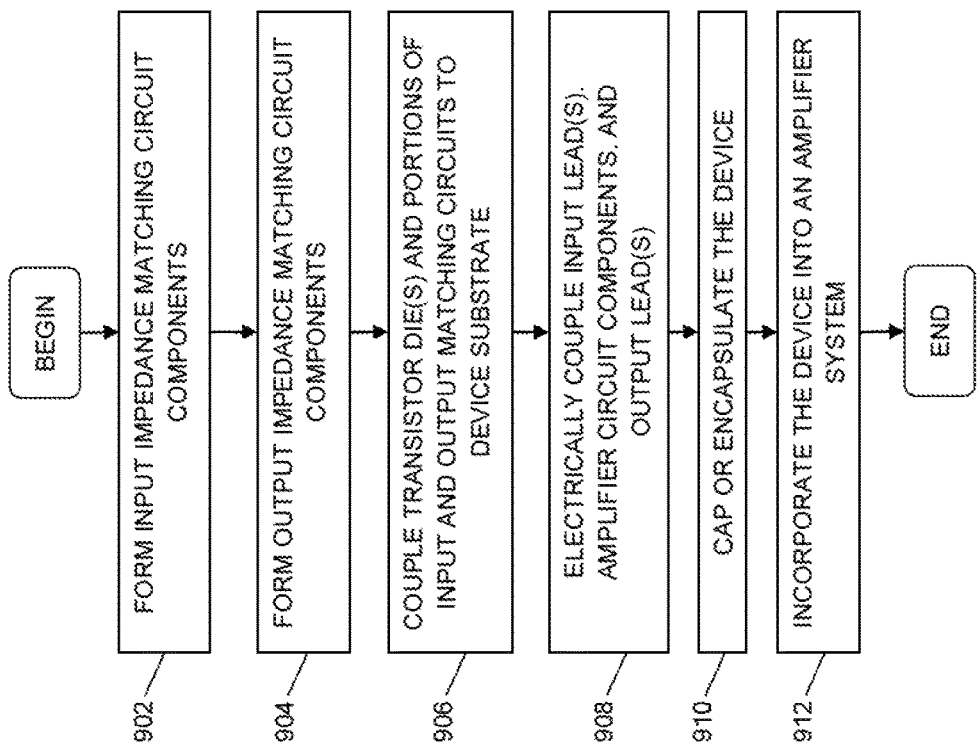
FIG. 9 is a flowchart of a method of manufacturing a packaged RF device with an input impedance matching circuit, in accordance with an example embodiment.

FIG. 9 is a flowchart of a method of manufacturing a packaged RF device (e.g., any of devices 200, 700, 800) with one or more, multiple-pole input impedance matching circuits (e.g., input impedance matching circuit 110, FIG. 1), in accordance with an example embodiment. The method may begin, in blocks 902 and 904, by forming components for one or more input and output impedance matching circuit components. For example, in block 902, for the input impedance matching circuit(s), one or more IPDs (e.g., IPDs 215, 511, 715, 717, FIGS. 2, 5, 7) may be formed, each of which includes two or more integrated capacitors (e.g., shunt capacitors 514, 518, FIGS. 5, 6), and an integrated inductor (e.g., inductor 515, FIGS. 5, 6). In an alternate embodiment, the shunt capacitors and inductor for each input impedance matching circuit may be integrated within a transistor die (e.g., transistor die 808, FIG. 8). In still other alternate embodiments, the shunt capacitors (e.g., corresponding to capacitors 114, 118, FIG. 1) may be implemented as discrete components, and the series inductor interconnecting the discrete capacitors (e.g., corresponding to inductor 115, FIG. 1) may be formed as a series of bondwires (e.g., during block 908).

Similarly, in block 904, for the output impedance matching circuit(s), one or more IPDs (e.g., IPDs 242, 742, 743, 842, 843, FIGS. 2, 7, 8) may be formed, each of which includes one or more integrated capacitors (e.g., shunt capacitors 142, 146, FIG. 1). In an alternate embodiment, the shunt capacitors for each output impedance matching circuit may be integrated within a transistor die or may be implemented as discrete components.

In block 906, die corresponding to the one or more active devices (e.g., transistor die 220, 720, 721, 808), input impedance matching circuits (e.g., IPDs 211, 511, 715, 717, or die 808), and output impedance matching circuits (e.g., IPDs 242, 742, 743, 842, 843) are coupled to a portion of the top surface of the substrate. In an air-cavity package embodiment, an isolation structure (e.g., isolation structure 208, FIG. 2) also may be coupled to the top surface off the substrate, and leads (e.g., input and output leads 202, 204, 702-705, 802, 804, 805) are coupled to the top surface of the isolation structure. In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

In block 908, the input lead(s), amplifier circuit components, and output lead(s) are electrically coupled together. For example, the electrical connections may be made using bondwires between the various device components and elements, as discussed previously. These bondwires may form inductive elements of the input and output impedance matching circuits, as also discussed previously.

In block 910, the device is capped (e.g., with cap 310, FIG. 3) or encapsulated (e.g., with mold compound 410, FIG. 4) to form an air-cavity or overmolded package, respectively. In block 912, the device may then be incorporated into a larger electrical system. For example, the device may be incorporated into a larger electrical system by physically coupling the device to a printed circuit board (PCB), electrically connecting the input lead(s) to a signal source, and electrically connecting the output lead(s) to a load. Although the various embodiments of devices discussed herein could be used in any of a variety of different types of amplifiers, an example of incorporation of an embodiment of a device into a Doherty amplifier will now be discussed in conjunction with FIG. 10.

Figure 10:
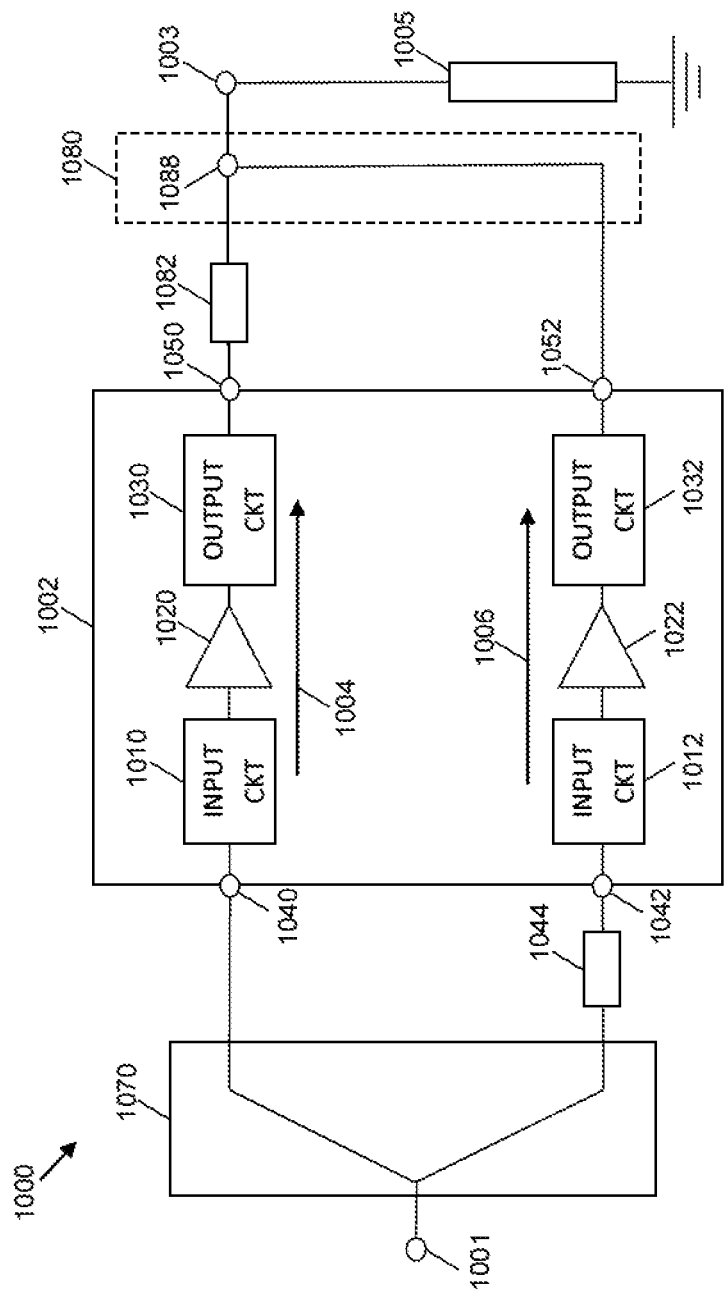
FIG. 10 is a schematic diagram of a Doherty amplifier with input impedance matching circuits, in accordance with an example embodiment.

FIG. 10 is a simplified schematic diagram of a Doherty amplifier system 1000 in which one or more multiple-pole input impedance matching circuits may be incorporated. Amplifier system 1000 includes an input node 1001, an output node 1003, an RF amplifier device 1002, a power divider 1070, and a power combiner 1080, according to an embodiment. The power divider 1070 is coupled between input node 1001 and input terminals 1040, 1042 to the RF amplifier device 1002, and the power combiner 1080 is coupled between output terminals 1050, 1052 of the RF amplifier device 1002 and output node 1003. An input signal received at input node 1001 is amplified by amplifier system 1000 and provided to a load 1005 (e.g., an antenna) via output node 1003. As will be described in more detail below, the amplifier system 1000 is configured in a Doherty amplifier topology.

The RF amplifier device 1002 includes multiple amplifier paths 1004, 1006. Each amplifier path 1004, 1006 includes an input impedance matching circuit (INPUT CKT) 1010, 1012, an amplifier stage 1020, 1022, and an output impedance matching circuit (OUTPUT CKT) 1030, 1032 coupled in series between input terminals 1040, 1042 and output terminals 1050, 1052 of the device 1002. According to an embodiment, one or more components (e.g., shunt capacitors and other components) of each input impedance matching circuit 1010, 1012 and each output impedance matching circuit 1030, 1032 may be implemented in an IPD (e.g., IPDs 215, 242, 715, 717, 742, 743, 842, 843). Alternatively, one or more components of each input and/or output impedance matching circuit may be integrated into the transistor die or implemented as discrete components.

Each of the input impedance matching circuits 1010, 1012 is configured to provide a desired input impedance at its respective input terminal 1040, 1042 at the fundamental frequency (or carrier frequency) of the amplifier system 1000. As discussed in detail previously, each input impedance matching circuit 1010, 1012 includes a multiple-pole input impedance matching circuit with at least one pole within the bandwidth of the amplifier, and at least one pole outside of the bandwidth of the amplifier.

Each of the output impedance matching circuits 1030, 1032 is configured to provide a desired output impedance at its respective output terminal 1050, 1052 at the fundamental frequency of the amplifier system 1000. In an exemplary embodiment, the amplifier system 1000 is used to transmit RF signals, and the fundamental frequency (or carrier frequency) is the frequency of transmittance.

According to an embodiment, the input impedance matching circuits 1010, 1012 are substantially identical to each other, and the output impedance matching circuits 1030, 1032 also are substantially identical to each other. In other embodiments, the input impedance matching circuits 1010, 1012 may be different from each other, and/or the output impedance matching circuits 1030, 1032 may be different from each other. It should be noted that the subject matter described herein is not intended to be limited to any particular configuration and/or circuit topology for the input impedance matching circuits 1010, 1012 and the output impedance matching circuits 1030, 1032. That being said, in an embodiment, one or both of the input impedance matching circuits 1010, 1012 are realized as a low-pass impedance matching circuit topology (e.g., a multiple-pole, shunt capacitance impedance matching circuit topology). In alternate embodiments, either or both of the input impedance matching circuits 1010, 1012 are realized as a high-pass impedance matching circuit topology. In an embodiment, either or both of the output impedance matching circuits 1030, 1032 are realized as a high-pass impedance matching circuit topology, in an embodiment. In an alternate embodiment, either or both of the output impedance matching circuits 1030, 1032 are realized as a low-pass impedance matching circuit topology.

The amplifier stages 1020, 1022 in RF amplifier device 1002 may be fabricated on the same die (e.g., as illustrated in FIG. 8), or each amplifier stage 1020, 1022 may be fabricated on separate die (e.g., as illustrated in FIGS. 2 and 7). Each of the amplifier stages 1020, 1022 includes an arrangement of one or more transistors. According to various embodiments, the amplifier stages 1020, 1022 may be symmetrical (i.e., substantially the same size) or asymmetrical (i.e., of different sizes).

Amplifier stage 1020 may be configured and operated as a main amplifier, and amplifier stage 1022 may be configured as and operated as a peaking amplifier. The main amplifier stage 1020 is configured as a Class AB amplifier, meaning that the transistor arrangement of main amplifier stage 1020 is biased to provide a conduction angle between 180 and 360 degrees. Conversely, the peaking amplifier stage 1022 is realized as a transistor arrangement configured as a Class C amplifier, meaning that the transistor arrangement of the peaking amplifier stage 1022 is biased to provide a conduction angle less than 180 degrees. Alternatively, the peaking amplifier stage 1022 may be connected to external control circuitry that dynamically adjusts the peaking amplifier's operating mode between Class AB and Class C at the RF signal's envelope rate depending on instantaneous output power requirements.

According to an embodiment, the multiple amplifier paths 1004, 1006 all are contained in a single device package with the input and output terminals 1040, 1042, 1050, 1052 providing external electronic connectivity to the device 1002. More specifically, the input and output terminals 1040, 1042, 1050, 1052 generally represent the package leads, pins, or other physical interfaces for creating electrical connections to the internal components (e.g., amplifier paths 1004, 1006) of the RF amplifier device 1002. Referring to the previously described embodiments, for example, input terminals 1040, 1042 may correspond to input leads 202, 702, 703, 802, and output terminals 1050, 1052 may correspond to output leads 204, 704, 705, 804, 805.

In the illustrated embodiment of FIG. 10, the amplifier system 1000 is configured for a Doherty amplifier implementation. In this regard, the power divider 1070 is configured to divide the input power of the input signal received at node 1001 into multiple portions (e.g., equal portions) of the input signal, where respective portions of the input signal are provided to input terminals 1040, 1042. For example, a first output of the power divider 1070 may be coupled to the input terminal 1040 corresponding to the first amplifier path 1004, and a second output of the power divider 1070 may be coupled to the input terminal 1042 corresponding to the second amplifier path 1006. The power divider 1070 may divide the input power equally among the amplifier paths 1004, 1006, such that roughly half of the input signal power is provided to each amplifier path 1004, 1006. Alternatively, the power divider 1070 may divide the power unequally.

According to an embodiment, the amplifier system 1000 includes a first phase inversion element 1044 between a second output of the power divider 1070 and the input terminal 1042 corresponding to the peaking amplifier path 1006. For example, the first phase inversion element 1044 may be implemented as a quarter wave transmission transformer (e.g., a 90° phase length transmission line) or a lumped element implementation of a 90° phase transformer, in various embodiments. According to an embodiment, the amplifier system 1000 also includes a second phase inversion element 1082 between the output terminal 1050 corresponding to the main amplifier path 1004 and a summing node 1088 of the power combiner 1080. The output terminal 1052 corresponding to the peaking amplifier path 1006 also is coupled to the summing node 1088. As with the first phase inversion element 1044, the second phase inversion element 1082 may be implemented as a quarter wave transmission transformer (e.g., a 90° phase length transmission line) or a lumped element implementation of a 90° phase transformer, in various embodiments. The combination of phase inversion elements 1044, 1082 ensures that the currents ultimately provided to summing node 1088 by the respective amplifier paths 1004, 1006 are provided substantially in-phase with each other. Accordingly, the current provided by summing node 1088 to output node 1003 (and to load 1005) represents the in-phase summation of the currents provided by amplifier paths 1004, 1006.

In an alternate embodiment, positive and negative phase shifts may be applied along both amplifier paths 1004, 1006 at the inputs of the device 1002 to achieve approximately 90° of phase difference between the signals processed through the device 1002 along the main and peaking amplifier paths 1004, 1006. Similarly, positive and negative phase shifts may be applied along both amplifier paths 1004, 1006 at the outputs of the device 1002 to ensure that the signals are combined in phase at summing node 1088. In another alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

It should be understood that FIG. 10 is a simplified representation of an amplifier system 1000 for purposes of explanation and ease of description, and that practical embodiments may include other devices and components to provide additional functions and features, and/or the amplifier system 1000 may be part of a much larger electrical system, as will be understood. For example, as implied previously, embodiments of devices discussed herein may be incorporated into amplifiers having a single amplification path or more than two amplification paths, as well as amplifiers having configurations other than Doherty configurations.

As discussed above, embodiments of the inventive subject matter include RF amplifiers and devices that include multiple-pole input impedance matching circuits, as opposed to conventional amplifiers that include single pole, low pass filters as input impedance matching circuits. More specifically, embodiments of the inventive subject matter include RF amplifiers and devices in which the amplifier's input impedance matching circuit has at least one pole located within the amplifier's bandwidth (i.e., between the lower and upper cutoff frequencies), and at least one other pole located outside (e.g., above) the amplifier's bandwidth. As will be shown in FIGS. 11-16, implementation of a pole within the amplifier's bandwidth has the unexpected result of increasing the power amplifier bandwidth and in-band gain flatness (e.g., by raising the low-end impedance), and the additional unexpected result of achieving near-zero linear phase distortion across the band.

Figure 11:
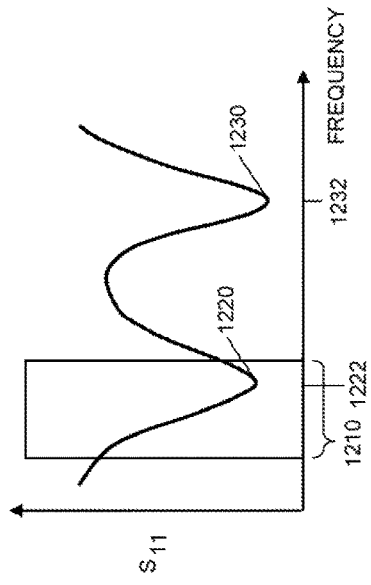
FIGS. 11 and 12 are graphs showing S parameters for a conventional input impedance matching circuit and an embodiment of an input impedance matching circuit, respectively.
Figure 12:
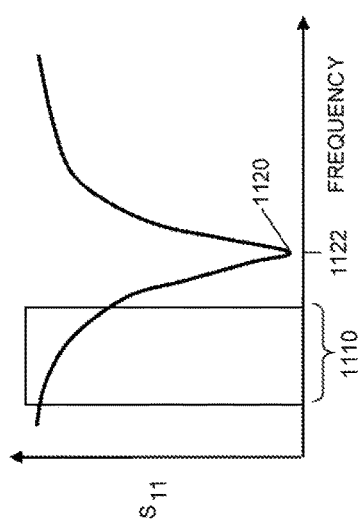

FIGS. 11-16 are graphs comparing various signal characteristics in conventional amplifiers and amplifiers configured according to various embodiments, where the signal characteristics are indicated relative to bandwidths 1110, 1210 of the amplifiers. For example, FIGS. 11 and 12 are graphs showing S11 parameters for a conventional input impedance matching circuit (FIG. 11) and S11 parameters for a two-pole embodiment of an input impedance matching circuit (FIG. 12) in which the input impedance matching circuit includes in-band and out-of-band poles. More specifically, FIG. 11 illustrates S11 parameters for a conventional input impedance matching circuit with a single pole 1120 at a frequency 1122 above the upper cutoff frequency of the amplifier's bandwidth 1110, and FIG. 12 illustrates S11 parameters for an embodiment of an amplifier with a two-pole input impedance matching circuit with a first pole 1220 at a frequency 1222 within the amplifier's bandwidth 1210, and a second pole 1230 at a frequency 1232 above the upper cutoff frequency of the amplifier's bandwidth 1220.

Figure 13:
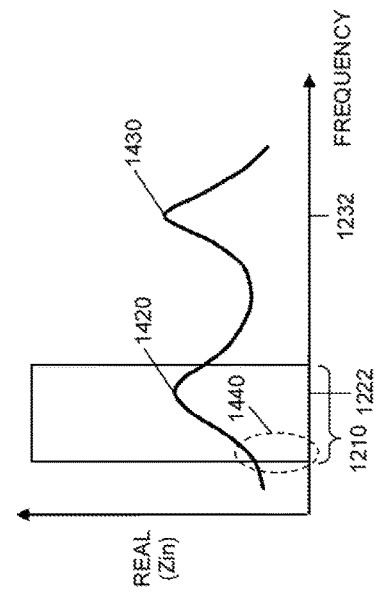
FIGS. 13 and 14 are graphs showing the real components of input impedance for a conventional input impedance matching circuit and an embodiment of an input impedance matching circuit, respectively.
Figure 14:
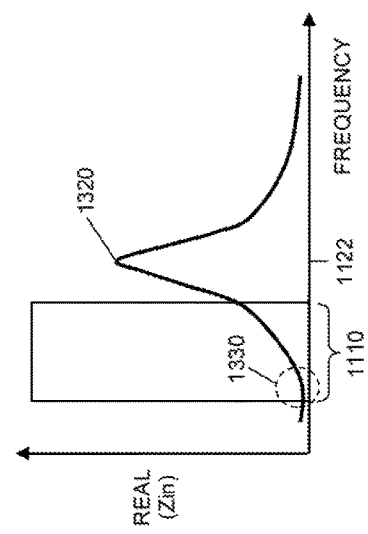

Depicting the input impedance filter characteristics in another way, FIGS. 13 and 14 are graphs showing the real components of input impedance for a conventional input impedance matching circuit (FIG. 13) and an embodiment of an input impedance matching circuit (FIG. 14) in which the input impedance matching circuit includes in-band and out-of-band poles. As the graphs indicate, the real input impedance for the conventional input impedance matching circuit has a single peak 1320 at the frequency 1122 corresponding to the input impedance matching circuit's pole (i.e., pole 1120, FIG. 11). As FIG. 13 indicates, the real impedance is close to zero at the lower end of the bandwidth 1110 (e.g., in area 1330). This near-zero impedance at the lower end of the bandwidth 1110 may cause significant difficulty when attempting to achieve an impedance match on a PCB to which the device ultimately is coupled. Conversely, the real input impedance for the two-pole embodiment of the input impedance matching circuit has two peaks 1420, 1430 at frequencies 1222, 1232 corresponding to the input impedance matching circuit's two poles (i.e., poles 1220, 1230, FIG. 12). As FIG. 14 indicates, implementation of the in-band pole raises the low end impedance (e.g., the impedance in area 1440). In addition, the out-of-band pole 1230 ensures sufficient amplifier bandwidth and in-band gain flatness.

Figures 15, 16:
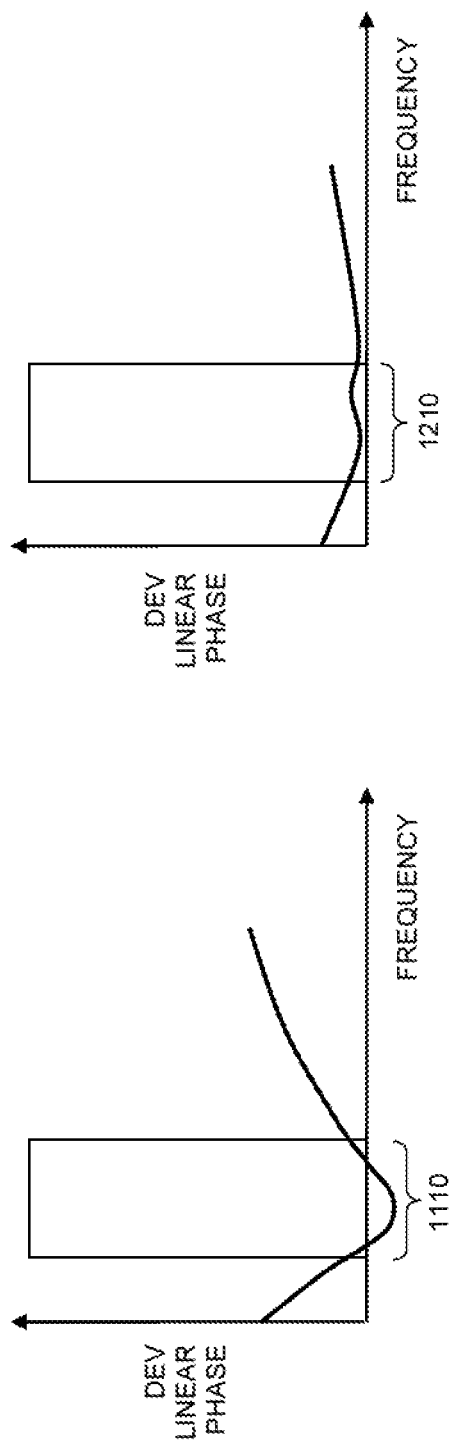
FIGS. 15 and 16 are graphs showing linear phase distortion for a conventional input impedance matching circuit and an embodiment of an input impedance matching circuit, respectively.

Another benefit of implementing at least one in-band pole is the achievement of near-zero linear phase distortion across the amplifier's bandwidth 1210. For example, FIGS. 15 and 16 are graphs showing linear phase distortion for an amplifier with a conventional one-pole input impedance matching circuit (FIG. 15) and an embodiment of a transistor with a two-pole input impedance matching circuit (FIG. 16), respectively. As FIG. 15 indicates, the conventional input impedance matching circuit yields a relatively large phase linearity variation across the bandwidth 1110, which may limit performance if the device were incorporated into a Doherty power amplifier. Conversely, as FIG. 16 indicates, a two-pole input impedance matching circuit according to an embodiment results in near-zero linear phase distortion across the bandwidth 1210, which may make incorporation of an embodiment of a multiple-pole input impedance matching circuit particularly advantageous in a Doherty power amplifier. As discussed previously, the ability to include multiple poles in an in-package, input impedance matching circuit is enabled by including embodiments of IPDs (e.g., IPDs 211, 511, 715, 717) and/or integrated inductors (e.g., integrated inductors 816, 817) within an amplifier package. Said another way, due to their compactness, the IPD and/or integrated inductor embodiments enable at least one additional pole to be included within an RF power amplifier device package (e.g., a standard RF power amplifier device package). Further, inclusion of the additional in-band pole in the RF power amplifier device package results in a flatter phase response, lower levels of impedance dispersion, and reduced linear phase distortion across the amplifier's bandwidth 1210, when compared with conventional devices and amplifiers.

An embodiment of a packaged amplifier device has a bandwidth defined by a range of frequencies between a low cutoff frequency and an upper cutoff frequency. The amplifier device includes an input lead configured to receive an input RF signal, an output lead configured to produce an amplified RF signal, and a transistor having a gate, a first current conducting terminal coupled to the output lead, and a second current conducting terminal coupled to a reference node. The amplifier device further includes an input impedance matching circuit having a filter input coupled to the input lead, a filter output coupled to the gate of the transistor, and a plurality of passive components that form a multiple pole filter. A first pole of the filter is positioned at a first frequency within the bandwidth, and a second pole of the filter is positioned at a second frequency outside the bandwidth, and the input impedance matching circuit is configured to filter the input RF signal to produce a filtered RF signal at the filter output.

According to a further embodiment, the input impedance matching circuit comprises first and second inductances and first and second capacitances. The first inductance has a first terminal coupled to the input lead, and a second terminal coupled to a first node. The first capacitance has a first terminal coupled to the first node, and a second terminal coupled to the reference node. The second inductance has a first terminal coupled to the first node, and a second terminal coupled to a second node. The second capacitance has a first terminal coupled to the second node, and a second terminal coupled to the reference node. The first and second inductance and the first and second capacitance define the first pole of the filter, and the second inductance and the second capacitance define the second pole of the filter. The second node is coupled to the gate of the transistor.

According to a further embodiment, the packaged amplifier device further includes an integrated passive device that includes the first capacitance, the second inductance, and the second capacitance, and a first plurality of wirebonds coupled between the input lead and the integrated passive device. The first plurality of wirebonds provides the first inductance.

An embodiment of an amplifier has a bandwidth defined by a range of frequencies between a low cutoff frequency and a upper cutoff frequency. The amplifier includes an amplifier input for receiving an input RF signal, an amplifier output for producing an amplified RF signal, and a transistor having a gate, a first current conducting terminal coupled to the amplifier output, and a second current conducting terminal coupled to a reference node. The amplifier further includes an input impedance matching circuit having a filter input coupled to the amplifier input, a filter output coupled to the gate of the transistor, and a multiple pole filter coupled between the filter input and the filter output. A first pole of the filter is positioned at a first frequency within the bandwidth, and a second pole of the filter is positioned at a second frequency outside the bandwidth. The input impedance matching circuit is configured to filter the input RF signal to produce a filtered RF signal at the filter output.

An embodiment of a method of manufacturing a packaged amplifier device having a bandwidth defined by a range of frequencies between a low cutoff frequency and a upper cutoff frequency includes physically coupling a transistor to a package substrate, wherein the transistor has a gate, a first current conducting terminal, and a second current conducting terminal, and physically coupling an input impedance matching circuit to the package substrate. The input impedance matching circuit includes a filter input, a filter output electrically coupled to the gate of the transistor, and a plurality of passive components that form a multiple pole filter. A first pole of the filter is positioned at a first frequency within the bandwidth, and a second pole of the filter is positioned at a second frequency outside the bandwidth. The input impedance matching circuit is configured to filter the input RF signal to produce a filtered RF signal at the filter output. The method further includes physically coupling an input lead and an output lead to the package substrate, electrically coupling the input lead to the filter input, and electrically coupling the first current conducting terminal of the transistor to the output lead.

According to a further embodiment, the transistor and at least a portion of the input impedance matching circuit are included in a monolithic integrated circuit die, and physically coupling the transistor and the input impedance matching circuit to the package substrate includes coupling the integrated circuit die to a surface of the package substrate.

According to another further embodiment, the transistor is included in a first integrated circuit die, at least a portion of the input impedance matching circuit is included in a second integrated circuit die, and physically coupling the transistor and the input impedance matching circuit to the package substrate includes physically coupling the first and second integrated circuit dies to the package substrate.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged amplifier device having a bandwidth defined by a range of frequencies between a low cutoff frequency and an upper cutoff frequency, the amplifier device comprising:
    an input lead configured to receive an input radio frequency (RF) signal;
    an output lead configured to produce an amplified RF signal;
    a reference node;
    a transistor die that includes
        a first node,
        a second node,
        a transistor having a gate, a first current conducting terminal coupled to the output lead, and a second current conducting terminal coupled to the reference node,
        a first integrated capacitance having a first terminal coupled to the first node, and a second terminal coupled to the reference node,
        a first inductance having a first terminal coupled to the first node, and a second terminal coupled to the second node, and
        a second integrated capacitance having a first terminal coupled to the second node, and a second terminal coupled to the reference node; and
    a second inductance having a first terminal coupled to the input lead and a second terminal coupled to the first node of the transistor die,
    wherein the first inductance, the first integrated capacitance, the second inductance, and the second integrated capacitance form a multiple pole filter of an input impedance matching circuit that is configured to filter the input RF signal to produce a filtered RF signal at the gate of the transistor, and wherein a first pole of the multiple pole filter is positioned at a first frequency within the bandwidth, and a second pole of the multiple pole filter is positioned at a second frequency outside the bandwidth.

2. The packaged amplifier device of claim 1, wherein the first and second inductance and the first and second capacitance define the first pole of the filter, and the first inductance and the second capacitance define the second pole of the filter.

3. The packaged amplifier device of claim 1, further comprising:
    a first plurality of wirebonds coupled between the input lead and the integrated passive device, wherein the first plurality of wirebonds provides the second inductance.

4. The packaged amplifier device of claim 1, wherein:
    the first frequency is in a range between 1.8 and 2.2 gigahertz; and
    the second frequency is greater than 2.2 gigahertz.

5. The packaged amplifier device of claim 1, further comprising:
    an output impedance matching circuit coupled between the first current carrying terminal and the output lead.

6. The packaged amplifier device of claim 1, wherein the input impedance matching circuit and the transistor define a first amplification path, and wherein the amplifier device further comprises one or more additional amplification paths in parallel with the first amplification path, wherein the one or more additional amplification paths are coupled between the input lead and the output lead.

7. The packaged amplifier device of claim 1, further comprising:

one or more additional input leads; and
one or more additional output leads, wherein the input impedance matching circuit and the transistor define a first amplification path between the input lead and the output lead, and wherein the amplifier device further comprises one or more additional amplification paths in parallel with the first amplification path, wherein the one or more additional amplification paths are coupled between the one or more additional input leads and the one or more additional output leads.

8. The packaged amplifier device of claim 1, further comprising:
a device substrate that includes the reference node, wherein the transistor die is physically coupled to a first surface of the device substrate; and
molding compound covering a portion of the input lead, a portion of the output lead, the transistor die, and the input impedance matching circuit to form an overmolded device package.

9. A packaged amplifier device having a bandwidth defined by a range of frequencies between a low cutoff frequency and an upper cutoff frequency, the amplifier device comprising:
an input lead configured to receive an input radio frequency (RF) signal;
an output lead configured to produce an amplified RF signal;
a device substrate that includes a reference node;
a transistor die physically coupled to a first surface of the device substrate, wherein the transistor die includes
a transistor having a gate, a first current conducting terminal coupled to the output lead, and a second current conducting terminal coupled to the reference node, and
a plurality of integrated passive components;
an input impedance matching circuit that includes a multiple pole filter having a filter input coupled to the input lead, a filter output coupled to the gate of the transistor, and the plurality of passive components of the transistor die, wherein a first pole of the filter is positioned at a first frequency within the bandwidth, and a second pole of the filter is positioned at a second frequency outside the bandwidth, and the input impedance matching circuit is configured to filter the input RF signal to produce a filtered RF signal at the filter output;
an isolation structure coupled to the first surface of the device substrate, wherein the input lead and the output lead are coupled to the isolation structure; and
a lid attached over a portion of the input lead, a portion of the output lead, a portion of the isolation structure, the transistor die, and the input impedance matching circuit to form an air cavity device package.

10. The packaged amplifier device of claim 9, wherein the plurality of passive components of the transistor die comprise:
a first integrated capacitance having a first terminal coupled to the input lead, and a second terminal coupled to the reference node;
a first inductance having a first terminal coupled to the input lead, and a second terminal coupled to a node; and
a second integrated capacitance having a first terminal coupled to the node, and a second terminal coupled to the reference node.

11. The packaged amplifier device of claim 10, wherein the input impedance matching circuit further comprises:
a second inductance having a first terminal coupled to the input lead and a second terminal coupled to the first integrated capacitance and the first inductance.

12. The packaged amplifier device of claim 9, wherein:
the first frequency is in a range between 1.8 and 2.2 gigahertz; and
the second frequency is greater than 2.2 gigahertz.

13. The packaged amplifier device of claim 9, further comprising:
an output impedance matching circuit coupled between the first current carrying terminal and the output lead.

14. A method of manufacturing a packaged amplifier device having a bandwidth defined by a range of frequencies between a low cutoff frequency and an upper cutoff frequency, the method comprising:
physically coupling an input lead and an output lead to a package substrate that has a ground reference;
physically coupling a transistor die to the package substrate, wherein the transistor die has
a first node,
a second node,
a first integrated capacitance having a first terminal coupled to the first node, and a second terminal coupled to the ground reference,
a first inductance having a first terminal coupled to the first node, and a second terminal coupled to the second node,
a second integrated capacitance having a first terminal coupled to the second node, and a second terminal coupled to the ground reference, and
a transistor with a gate coupled to the second node, a first current conducting terminal, and a second current conducting terminal;
electrically coupling the first current conducting terminal of the transistor to the output lead; and
physically coupling a second inductance between the input lead and the first node of the transistor die, wherein the first integrated capacitance, the second integrated capacitance, the first inductance, and the second inductance form a multiple pole filter that is configured to filter the input RF signal to produce a filtered RF signal at the gate of the transistor, wherein a first pole of the filter is positioned at a first frequency within the bandwidth, and a second pole of the filter is positioned at a second frequency outside the bandwidth.

15. The method of claim 14, wherein the first and second inductance and the first and second integrated capacitance define the first pole of the filter, and the first inductance and the second integrated capacitance define the second pole of the filter.

16. The method of claim 14, wherein physically coupling the second inductance between the input lead and the first node of the transistor die comprises coupling a first plurality of wirebonds corresponding to the second inductance between the input lead and a first contact pad of the transistor die.

17. The method of claim 14, further comprising:
physically coupling an isolation structure to the device substrate, wherein the input lead and the output lead are coupled to the isolation structure; and
attaching a lid over a portion of the input lead, a portion of the output lead, a portion of the isolation structure, and the transistor die to form an air cavity device package.

18. The method of claim 14, further comprising:
covering a portion of the input lead, a portion of the output lead, and the transistor die with molding compound to form an overmolded device package.

* * * * *